United States Patent
Wang et al.

(10) Patent No.: US 6,281,146 B1
(45) Date of Patent: Aug. 28, 2001

(54) PLASMA ENHANCED CHEMICAL VAPOR DEPOSITION (PECVD) METHOD FOR FORMING MICROELECTRONIC LAYER WITH ENHANCED FILM THICKNESS UNIFORMITY

(75) Inventors: Ying-Lang Wang, Taichung County; Hui-Ling Wang, Hsin-Chu; Jowei Dun, Hsin-Chu; Szu-An Wu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/396,517

(22) Filed: Sep. 15, 1999

(51) Int. Cl.$^7$ .......................... H01L 21/31; H01L 21/469
(52) U.S. Cl. .......................................... 438/788; 438/792
(58) Field of Search .................... 438/680, 681, 438/788, 745, 776, 771, 463, 706

(56) References Cited

U.S. PATENT DOCUMENTS

| | | | |
|---|---|---|---|
| 4,567,645 | 2/1986 | Cavanagh et al. ................. | 29/576 B |
| 5,221,561 | * 6/1993 | Flicstein et al. ..................... | 427/534 |
| 5,252,178 | * 10/1993 | Moslehi ............................... | 156/643 |
| 5,334,556 | 8/1994 | Guldi ................................... | 437/248 |
| 5,482,876 | 1/1996 | Hsieh et al. .......................... | 437/40 |
| 5,888,309 | * 3/1999 | Yu ........................................ | 134/1.2 |

OTHER PUBLICATIONS

S.M. Sze, "VLSI Technology", McGraw–Hill, Inc., New York (1988), pp. 235–236.

* cited by examiner

Primary Examiner—David Nelms
Assistant Examiner—David Nhu
(74) Attorney, Agent, or Firm—George O. Saile; Stephen B. Ackerman; Stephen G. Stanton

(57) ABSTRACT

A method for forming a microelectronic layer. There is first provided a substrate. There is then formed over the substrate the microelectronic layer while employing a plasma enhanced chemical vapor deposition (PECVD) method employing a source material gas and a carrier gas, wherein there is employed a sufficiently low plasma power, a sufficiently low source material gas:carrier gas flow rate ratio and a sufficiently high carrier gas atomic mass such that the microelectronic layer is formed with enhanced film thickness uniformity. The method may be employed for forming ion implant screen layers, such as silicon oxide ion implant screen layers, with enhanced film thickness uniformity.

17 Claims, 2 Drawing Sheets

PLASMA ENHANCED CHEMICAL VAPOR DEPOSITION (PECVD) METHOD FOR FORMING MICROELECTRONIC LAYER WITH ENHANCED FILM THICKNESS UNIFORMITY

BACKGROUND OF THE INVENTION

1. Field of the Invention

The present invention relates generally to methods for forming microelectronic layers within microelectronic fabrications. More particularly, the present invention relates methods for forming with enhanced film thickness uniformity microelectronic layers within microelectronic fabrications.

2. Background of the Invention

Microelectronic fabrications are formed from microelectronic substrates over which are formed patterned microelectronic conductor layers which are separated by microelectronic dielectric layers.

As microelectronic fabrication integration levels increased, and microelectronic device and patterned microelectronic conductor layer dimensions have decreased, it has become increasingly important within the art of microelectronic fabrication to form microelectronic layers with enhanced film thickness uniformity. Of the various types of microelectronic layers which it may be desired to form with enhanced film thickness uniformity within microelectronic fabrications, it is often particularly important to form an ion implant screen layer with enhanced film thickness uniformity. An ion implant screen layer within a microelectronic fabrication is typically, but not exclusively, employed to screen dopant ions implanted into a semiconductor substrate employed within a semiconductor integrated circuit microelectronic fabrication. Among other purposes, the ion implant screen layer generally provides: (1) a contamination shield to a semiconductor substrate upon which it is formed; (2) an implanted ion scattering impediment which minimizes channeling of implanted ions within a semiconductor substrate upon which it is formed; and (3) a physical barrier inhibiting outdiffusion of implanted dopant ions from within a semiconductor substrate upon which it is formed.

Traditionally, ion implant screen layers within semiconductor integrated circuit microelectronic fabrications are formed employing a thermal oxidation of a silicon semiconductor substrate to form a silicon oxide ion implant screen layer. While silicon oxide ion implant screen layers formed employing thermal oxidation methods are generally serviceable and desirable within the art of microelectronic fabrication, silicon oxide ion implant screen layers formed employing thermal oxidation methods are nonetheless not entirely without problems in the art of microelectronic fabrication. In particular, silicon oxide ion implant screen layers formed employing thermal oxidation methods are generally formed incident to a significant thermal excursion of a silicon semiconductor substrate which may deleteriously affect a dopant profile of a pre-existing doped region formed within the silicon semiconductor substrate. While silicon oxide ion implant screen layers formed employing conventional plasma enhanced chemical vapor deposition (PECVD) methods would theoretically largely avoid thermal excursion concerns when forming silicon oxide ion implant screen layers within microelectronic fabrications, silicon oxide ion implant screen layers formed employing plasma enhanced chemical vapor deposition (PECVD) methods nonetheless typically provide silicon oxide ion implant screen layers with compromised film thickness uniformity in comparison with silicon oxide ion implant screen layers formed employing thermal oxidation methods.

Thus, it is towards the goal of forming within a microelectronic fabrication a silicon containing dielectric layer, such as but not limited to a silicon oxide dielectric layer, which may be employed as an ion implant screen layer, where the silicon containing dielectric layer is formed with enhanced film thickness uniformity and with minimal temperature excursion, that the present invention is more specifically directed. In a more general sense, the present invention is also directed towards the goal of forming within microelectronic fabrications other microelectronic layers, such as but not limited to microelectronic conductor layers, microelectronic semiconductor layers and microelectronic dielectric layers with enhanced film thickness uniformity and minimal temperature excursion.

Various methods have been disclosed in the art of microelectronic fabrication for either: (1) forming silicon containing microelectronic layers with desirable properties within microelectronic fabrications; or (2) employing silicon containing microelectronic layers with desirable properties within microelectronic fabrications.

For example, Sze, in VLSI Technology, McGraw-Hill, N.Y. (1988), pp. 235–36, discloses various deposition methods and materials for forming silicon containing dielectric layers, as well as polysilicon layers, within microelectronic fabrications.

In addition, Cavanagh et al., in U.S. Pat. No. 4,567,645, discloses a method for forming with attenuated defect density a buried subcollector region for use within a semiconductor integrated circuit device formed within a semiconductor substrate. The method employs when forming the buried subcollector region while employing an ion implant method a silicon oxide ion implant screen layer which is partially stripped from a silicon semiconductor substrate within which is formed the buried subcollector region and then reoxidized to its original thickness after ion implanting the buried subcollector region within the silicon semiconductor substrate and prior to thermally annealing the silicon semiconductor substrate to repair damage within the silicon semiconductor substrate incurred incident to ion implanting the buried subcollector region within the silicon semiconductor substrate.

Further, Guldi, in U.S. Pat. No. 5,334,556, discloses a method for improving silicon oxide gate dielectric layer integrity within a silicon oxide gate dielectric layer formed within a field effect transistor (FET) employed within a semiconductor integrated circuit microelectronic fabrication. The method employs an oxidizing atmosphere, in part, when thermally annealing a pair of ion implanted source/drain regions within the field effect transistor (FET) within the semiconductor integrated circuit microelectronic fabrication.

Finally, Hsieh et al., in U.S. Pat. No. 5,482,876, discloses a method for forming within a semiconductor integrated circuit microelectronic fabrication while employing a (100) silicon semiconductor substrate a field effect transistor (FET) without spacer mask edge defects. The method employs when ion implanting a pair of source/drain regions within the (100) silicon semiconductor substrate within the field effect transistor (FET) within the semiconductor integrated circuit microelectronic fabrication while employing a gate electrode, a gate dielectric layer and a pair of dielectric spacer layers as a mask a ion implant screen layer formed thereupon, where an upper surface of the ion implant screen layer has an angle of elevation not exceeding 54.44 degrees with respect to the (100) silicon semiconductor substrate.

Desirable in the art of microelectronic fabrication are additional methods and materials for forming within microelectronic fabrications dielectric layers which may be employed as ion implant screen layers, where the dielectric layers are formed with enhanced film thickness uniformity and with minimal temperature excursion. More generally desirable in the art of microelectronic fabrication are additional methods and materials through which there may be formed within microelectronic fabrications microelectronic layers including but not limited to microelectronic conductor layers, microelectronic semiconductor layers and microelectronic dielectric layers, with enhanced film thickness uniformity and minimal temperature excursion.

It is towards the foregoing objects that the present invention is both specifically and more generally directed.

SUMMARY OF THE INVENTION

A first object of the present invention is to provide a method for forming a microelectronic layer within a microelectronic fabrication.

A second object of the present invention is tor provide a method in accord with the first object of the present invention, where the microelectronic layer is formed with enhanced film thickness uniformity and minimal temperature excursion.

A third object of the present is to provide a method in accord with the first object of the present invention and the second object of the present invention, which method is readily commercially implemented.

In accord with the objects of the present invention, there is provided by the present invention a method for forming a microelectronic layer within a microelectronic fabrication. To practice the method of the present invention, there is first provided a substrate. There is then formed over the substrate the microelectronic layer while employing a plasma enhanced chemical vapor deposition (PECVD) method employing a source material gas and a carrier gas. Within the plasma enhanced chemical vapor deposition (PECVD) method there is employed a sufficiently low plasma power, a sufficiently low source material gas:carrier gas flow rate ratio and a sufficiently high carrier gas atomic mass such that the microelectronic layer is formed with enhanced film thickness uniformity.

Within the method of the present invention the microelectronic layer may be a silicon containing dielectric layer employed as an ion implant screen layer.

The present invention provides a method for forming a microelectronic layer within a microelectronic fabrication, where the microelectronic layer is formed with enhanced film thickness uniformity and minimal temperature excursion.

The present invention realizes the foregoing object by employing when forming the microelectronic layer, which may be a silicon containing dielectric layer employed as an ion implant screen layer, a plasma enhanced chemical vapor deposition (PECVD) method employing a source material gas and a carrier gas. Within the plasma enhanced chemical vapor deposition (PECVD) method there is employed a sufficiently low plasma power, a sufficiently low source material gas:carrier gas flow rate ratio and a sufficiently high carrier gas atomic mass such that the microelectronic layer is formed with enhanced film thickness uniformity.

The method of the present invention is readily commercially implemented. The present invention employs methods and materials as are otherwise generally known in the art of microelectronic fabrication. Since it is a materials selection and process control which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which for a material part of this disclosure, wherein.

DESCRIPTION OF THE PREFERRED EMBODIMENTS

There is provided by the present invention a method for forming a microelectronic layer within a microelectronic fabrication, where the microelectronic layer is formed with enhanced film thickness uniformity and minimal temperature excursion. To practice the method of the present invention, there is first provided a substrate. There is then formed over the substrate the microelectronic layer while employing a plasma enhanced chemical vapor deposition (PECVD) method employing a source material gas and a carrier gas. Within the plasma enhanced chemical vapor deposition (PECVD) method there is employed a sufficiently low plasma power, a sufficiently low source material gas:carrier gas flow rate ratio and a sufficiently high carrier gas atomic mass such that the microelectronic layer is formed with enhanced film thickness uniformity and minimal temperature excursion.

Within the method of the present invention, the microelectronic layer may be a silicon containing dielectric layer employed as an ion implant screen layer.

While the more specific preferred embodiment of the present invention discloses the present invention within the context of forming a silicon containing dielectric layer as an ion implant screen layer within a silicon semiconductor integrated circuit microelectronic fabrication, the method of the present invention may also be employed for forming with enhanced film thickness uniformity and minimal temperature excursion within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications microelectronic layers including but not limited to microelectronic conductor layers, microelectronic semiconductor layers and microelectronic dielectric layers.

The method of the present invention provides particular value when forming single-component or multi-component inorganic layers within microelectronic fabrications, where the single-component or multi-component inorganic layers may be formed as oxides, nitrides, borides, carbides, and homogeneous or heterogeneous aggregates thereof, while employing plasma enhanced chemical vapor deposition (PECVD) methods. Such single-component or multi-component inorganic layers may comprise microelectronic superconductor layers, microelectronic conductor layers, microelectronic semiconductor layers and microelectronic dielectric layers.

First Preferred Embodiment

Figure 1:
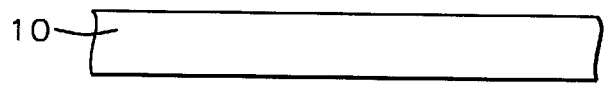
FIG. 1 and FIG. 2 show a pair of schematic cross-sectional diagrams illustrating the results of forming in accord with a general embodiment of the present invention which comprises a first preferred embodiment of the present invention a microelectronic layer within a microelectronic fabrication, where the microelectronic layer is formed with enhanced film thickness uniformity and minimal temperature excursion.
Figure 2:
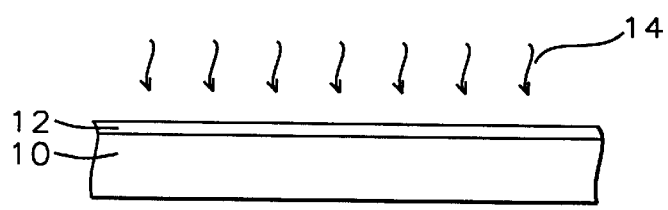

Referring now to FIG. 1 and FIG. 2, there is shown a pair schematic cross-sectional diagrams illustrating the results of forming in accord with a general embodiment of the present invention which comprises a first preferred embodiment of the present invention a microelectronic layer within a microelectronic fabrication, where the microelectronic layer is formed with enhanced film thickness uniformity and minimal temperature excursion. Shown in FIG. 1 is a schematic cross-sectional diagram of the microelectronic fabrication at an early stage in its fabrication in accord with the first preferred embodiment of the present invention.

Shown in FIG. 1 a substrate 10 which is employed within a microelectronic fabrication.

Within the first preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be a substrate alone employed within the microelectronic fabrication. In the alternative, the substrate 10 may be the substrate employed within the microelectronic fabrication, where the substrate has formed thereupon or thereover, and thus incorporated therein, any of several additional microelectronic layers as are conventional within the microelectronic fabrication within which is employed the substrate. Such additional microelectronic layers may, similarly with the substrate, be formed employing microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly but not exclusively when the substrate 10 is a semiconductor substrate employed within a semiconductor integrated circuit microelectronic fabrication, typically and preferably has formed thereupon and/or thereover, and thus incorporated therein, microelectronic devices as a conventional within the microelectronic fabrication within which is employed the substrate 10. Such microelectronic devices typically include, but are not limited to, resistors, transistors, diodes and capacitors.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the substrate 10 a blanket microelectronic layer 12 while employing a plasma enhanced chemical vapor deposition (PECVD) method which employs a deposition plasma 14.

Within the present invention and the first preferred embodiment of the present invention, the deposition plasma 14 employs a source material gas and a carrier gas at a sufficiently low plasma power, a sufficiently low source material gas:carrier gas flow rate ratio and a sufficiently high carrier gas atomic mass such that there is enhanced a film thickness uniformity when forming the blanket microelectronic layer 12. Similarly, the plasma enhanced chemical vapor deposition (PECVD) method also provides for minimal temperature excursion when forming the blanket microelectronic layer 12, typically in a range of from about 350 to about 450 degrees centigrade. While the blanket microelectronic layer 12 may be formed from any of several materials which may be deposited employing a plasma enhanced chemical vapor deposition (PECVD) method, the method of the present invention provides particular value when forming single-component or multi-component inorganic layers within microelectronic fabrications, where the single-component or multi-component inorganic layers may be formed as oxides, nitrides, borides, carbides, and homogeneous or heterogeneous aggregates thereof, while employing plasma enhanced chemical vapor deposition (PECVD) methods. Such single component or multi-component inorganic layers may comprise microelectronic superconductor layers, microelectronic conductor layers, microelectronic semiconductor layers and microelectronic dielectric layers.

Within the present invention and the first preferred embodiment of the present invention, it is intended that the source material gas and carrier gas may also include, but are not limited to, materials which are more accurately described as being supplied as a source material vapor and/or a carrier vapor.

Similarly, in accord with the first preferred embodiment of the present invention, the deposition plasma 14 preferably employs, in general, but more particularly when forming the blanket microelectronic layer upon an eight inch diameter substrate: (1) a radio frequency source plasma power preferably from about 50 to about 200 watts, more preferably from about 80 to about 150 watts, most preferably from about 100 to about 130 watts at a source radio frequency of 13.56 MHZ, (in comparison with a more conventional radio frequency source plasma power of from about 200 to about 500 watts); (2) a source material gas:carrier gas flow rate ratio preferably from about 1:100 to about 1:300, more preferably from about 1:150 to about 1:250, most preferably from about 1:175 to about 1:225 (in comparison with a more conventional flow rate ratio of from about 1:20 to about 1:80); and (3) a carrier gas atomic mass of at least about 30 amu, which is typically and preferably provided by an inert argon carrier gas, but may also be provided by a higher order homologous carrier gas, such as a xenon carrier gas (in comparison with more conventional carrier gases such as helium and nitrogen, either of which it is desired not to employ within the present invention).

Within the present invention and the first preferred embodiment of the present invention, it is intended that the source material gas, when viewed in conjunction with the carrier gas, may include and will typically include multiple source material gases provided at similar flow rates to provide a microelectronic layer with a desired stoichiometry. For example and without limitation, when the blanket microelectronic layer 12 is formed of a multicomponent oxide material, the source material gas will typically and preferably include multiple source material gases and an oxidant source material gas, the aggregate flow of which may be controlled in conjunction with the flow of the carrier gas and the atomic mass of the carrier gas. Alternatively, when one source material gas, such as an oxidant source material gas, is typically employed in substantial excess of an other source material gas or gases, such as a silicon source material gas or an aggregate of other source material gases which may be employed to form a multicomponent oxide, the flow of the other source material gas or gases is preferably controlled within the context of an aggregate flow of the source material gas in substantial excess and the carrier gas.

Upon forming the microelectronic fabrication whose schematic cross-sectional diagram is illustrated in FIG. 2, there is formed a microelectronic fabrication having formed therein a microelectronic layer with enhanced film thickness uniformity and minimal temperature excursion. The microelectronic layer is formed with the enhanced film thickness uniformity and minimal temperature excursion incident to forming the microelectronic layer while employing a plasma enhanced chemical vapor deposition (PECVD) method, where the plasma enhanced chemical vapor deposition (PECVD) method employs a source material gas and a carrier gas at: (1) a sufficiently low plasma power; (2) a sufficiently low source material gas:carrier gas flow rate ratio; and (3) a sufficiently high carrier gas atomic mass, such that the microelectronic layer is formed with an enhanced film thickness uniformity.

Second Preferred Embodiment

Referring now to FIG. 3 to FIG. 6, there is shown a series of schematic cross-sectional diagrams illustrating the results of forming within a semiconductor integrated circuit microelectronic fabrication in accord with a more specific embodiment of the present invention which comprises a second preferred embodiment of the present invention a silicon containing dielectric layer which serves as an ion implant screen layer within the semiconductor integrated circuit microelectronic fabrication, where the silicon containing dielectric layer is formed with enhanced film thickness uniformity and minimal temperature excursion.

Figure 3:
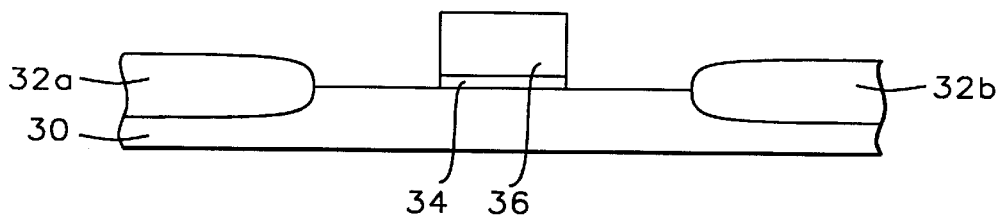
FIG. 3, FIG. 4, FIG. 5 and FIG. 6 show a series of schematic cross-sectional diagrams illustrating the results of forming in accord with a more specific embodiment of the present invention which comprises a second preferred embodiment of the present invention a silicon containing dielectric layer as an ion implant screen layer within a silicon semiconductor integrated circuit microelectronic fabrication, where the silicon containing dielectric layer is formed with enhanced film thickness uniformity and minimal temperature excursion.

Shown in FIG. 3 is a schematic cross-sectional diagram of the semiconductor integrated circuit microelectronic fabrication at an early stage in its fabrication in accord with the second preferred embodiment of the present invention.

Shown in FIG. 3 is a semiconductor substrate 30 having formed therein and thereupon a pair of isolation regions 32a and 32b which defines an active region of the semiconductor substrate 30. Although semiconductor substrates are known in the art of semiconductor integrated circuit microelectronic fabrication with either dopant polarity, several dopant concentrations and various crystallographic orientations, for the second preferred embodiment of the present invention the semiconductor substrate 30 is typically and preferably a (100) silicon semiconductor substrate having an N- or P-doping.

Similarly, although it is also known in the art of semiconductor integrated circuit microelectronic fabrication that isolation regions may be formed within and/or upon a semiconductor substrate to define an active region of the semiconductor substrate while employing methods including but not limited to isolation region thermal growth methods and isolation regions deposition/patterning methods, for the second preferred embodiment of the present invention, the isolation regions 32a and 32b are preferably formed within and upon the semiconductor substrate 30 to define the active region of the semiconductor substrate 30 while employing an isolation region thermal growth method at a temperature of from about 900 to about 1100 degrees centigrade to form the isolation regions 32a and 32b of silicon oxide formed within and upon the semiconductor substrate 30.

Finally, there is also shown within FIG. 3 formed centered upon the active region of the semiconductor substrate 30 a gate dielectric layer 34 having formed and aligned thereupon a gate electrode 36, where the gate dielectric layer 34 and the gate electrode 36 are typically and preferably employed within a field effect transistor (FET) further formed employing the semiconductor substrate 30. Within the second preferred embodiment of the present invention, both the gate dielectric layer 34 and the gate electrode 36 may be formed employing methods as are conventional in the art of semiconductor integrated circuit microelectronic fabrication.

For example, although it is known in the art of semiconductor integrated circuit microelectronic fabrication that gate dielectric layers may be formed within field effect transistors (FETs) for use within semiconductor integrated circuit microelectronic fabrications through patterning, through methods as are conventional in the art of semiconductor integrated circuit microelectronic fabrication, of blanket gate dielectric layers formed within semiconductor integrated circuit microelectronic fabrications employing methods including but not limited to blanket gate dielectric layer thermal growth methods and blanket gate dielectric layer deposition/patterning methods, for the second preferred embodiment of the present invention, the gate dielectric layer 34 is preferably formed through patterning, through methods as are conventional in the art of semiconductor integrated circuit microelectronics fabrication, of a blanket gate dielectric layer formed through thermal oxidation of the active region of the semiconductor substrate 30 at a temperature of from about 850 to about 1000 degrees centigrade. Typically and preferably, the gate dielectric layer 34 so formed is formed to a thickness of from about 30 to about 70 angstroms.

Similarly, although it is also known in the art of semiconductor integrated circuit microelectronic fabrication that gate electrodes may be formed via patterning, while employing methods as are conventional in the art of semiconductor integrated circuit microelectronic fabrication, of blanket layers of gate electrode materials including but not limited to metal, metal alloy, highly doped polysilicon (i.e. greater than about 1E20 dopant atoms per cubic centimeter) and polycide (metal silicide/highly doped polysilicon stack layer) gate electrode materials, for the second preferred embodiment of the present invention, the gate electrode 36 is typically and preferably formed through patterning, through methods as are conventional in the art of semiconductor integrated circuit microelectronic fabrication, of a blanket highly doped polysilicon or polycide gate electrode material layer formed upon the blanket gate oxide layer and the isolation regions 32a and 32b. Typically and preferably, the gate electrode 36 so formed is formed to a thickness of from about 1000 to about 4000 angstroms.

Figure 4:
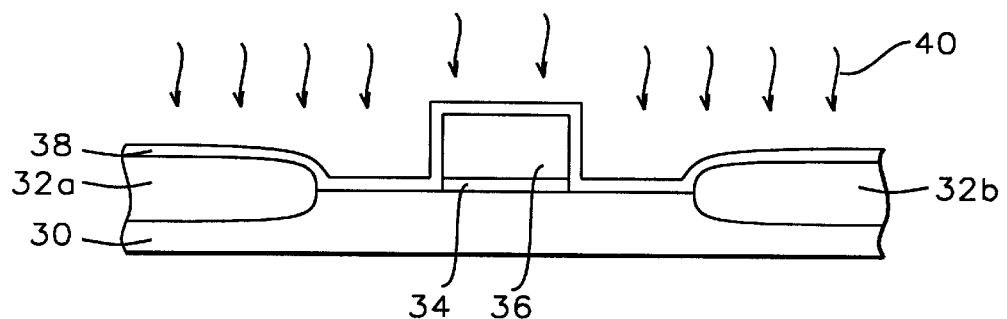

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed over the semiconductor substrate 30 and upon: (1) the isolation regions 32a and 32b; (2) the gate electrode 36; (3) the exposed portions of the gate dielectric layer 34; and (4) the exposed portions of the active region of the semiconductor substrate 30, a conformal silicon containing dielectric layer 38 which serves as an ion implant screen layer when subsequently forming a pair of source/drain regions into the active regions of the semiconductor substrate 30 at areas not covered by the gate dielectric layer 34 and the gate electrode 36.

Within the second preferred embodiment of the present invention, the conformal silicon containing dielectric layer 38 is preferably formed within the context of the methods and limitations employed for forming the microelectronic layer 12 within the first preferred embodiment of the present invention, as illustrated within the schematic cross-sectional diagram of FIG. 2. More particularly, the conformal silicon containing dielectric layer 38 is formed employing a plasma enhanced chemical vapor deposition (PECVD) method, where the plasma enhanced chemical vapor deposition (PECVD) method employs a silicon source material gas, an additional source material gas and a carrier gas at a sufficiently low plasma power, a sufficiently low silicon source material gas:aggregate additional source material gas plus carrier gas flow rate ratio and a sufficiently high carrier gas atomic mass such that the silicon containing dielectric layer is formed with enhanced film thickness uniformity. Due to the presence of the additional source material gas, the silicon source material gas:aggregate additional source material gas plus carrier gas flow rate ratios are revised by about 20 percent in comparison with the silicon source material:carrier gas flow rate ratios disclosed above for the first preferred embodiment of the present invention (i.e. the silicon source material gas:aggregate additional source material gas plus carrier gas flow rated are preferably from about 1:120 to about 1:360, more preferably from about 1:180 to about 1:300, most preferably from about 1:210 to about 1:270).

Within the second preferred embodiment of the present invention, the silicon containing dielectric layer 38 may be selected from the group of silicon containing dielectric layers including but not limited to silicon oxide dielectric layers, silicon nitride dielectric layers and silicon oxynitride dielectric layers formed employing silicon source material gases including but not limited to silane, disilane and tetraethylorthosilicate (TEOS). More typically and preferably, the silicon containing dielectric layer 38 is a silicon oxide dielectric layer formed employing silane as a silicon source material gas, nitrous oxide or an other oxidant as an additional oxidant source material gas and argon as a carrier gas.

Within the second preferred embodiment of the present invention when forming the blanket conformal silicon containing dielectric layer 38 as a blanket silicon oxide dielectric layer over an eight inch diameter semiconductor substrate 30, while employing silane as a silicon source material gas, nitrous oxide as an oxidant source material gas and argon as a carrier gas, the deposition plasma 40 typically and preferably also employs: (1) a reactor chamber pressure of from about 1 to about 10 torr; (2) a source radio frequency source power of from about 50 to about 200 watts at a source radio frequency of 13.56 MHZ; (3) a semiconductor substrate 30 temperature of from about 350 to about 450 degrees centigrade; (4) a showerhead nozzle spacing of from about 450 to about 500 mils; (5) a silane silicon source material gas flow rate of from about 10 to about 20 standard cubic centimeters per minute (sccm); (6) a nitrous oxide oxidant source material flow rate of from about 300 to about 400 standard cubic centimeters per minute (sccm); and (7) an argon carrier gas flow rate of from about 2000 to about 2500 standard cubic centimeters per minute (sccm). Typically and preferably, the blanket silicon containing dielectric layer 38 is formed to a thickness of from about 50 to about 200 angstroms.

Figure 5:
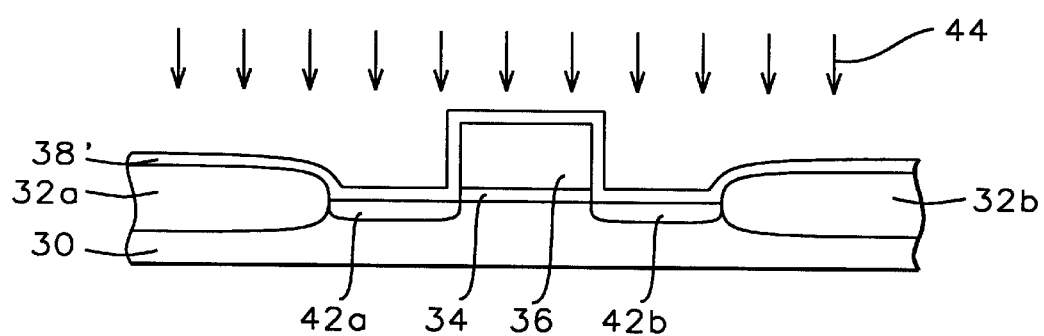

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed into the active regions of the semiconductor substrate 30 at areas not covered by the gate dielectric layer 34 and the gate electrode 36 a pair of source/drain regions 42a and 42b through use of a beam of implanting ions 44. As is illustrated within the schematic cross-sectional diagram of FIG. 5, upon treatment with the beam of implanting ions 44, there is formed from the blanket silicon containing dielectric layer 38 an ion implanted blanket silicon containing dielectric layer 38'. Although not specifically illustrated within the schematic cross-sectional diagram of FIG. 5, other structures within the semiconductor integrated circuit microelectronic fabrication whose schematic cross-sectional diagram is illustrated in FIG. 5 are also ion implanted incident to treatment with the beam of implanting ions 44.

Within the second preferred embodiment of the present invention, the beam of the implanting ions 44 is provided employing methods and materials as are conventional in the art of semiconductor integrated circuit microelectronic fabrication. Such methods and materials will typically and preferably employ ion implant methods employing dopant ions selected from the group of dopant ions including but not limited to arsenic containing dopant ions, boron containing dopant ions and phosphorus containing dopant ions, and occasionally also include electrically inactive dopant ions, typically and preferably implanted at an ion implantation dose of from about 1E13 to about 6E15 ions per square centimeter and an ion implantation energy of from about 20 to about 50 keV.

Figure 6:
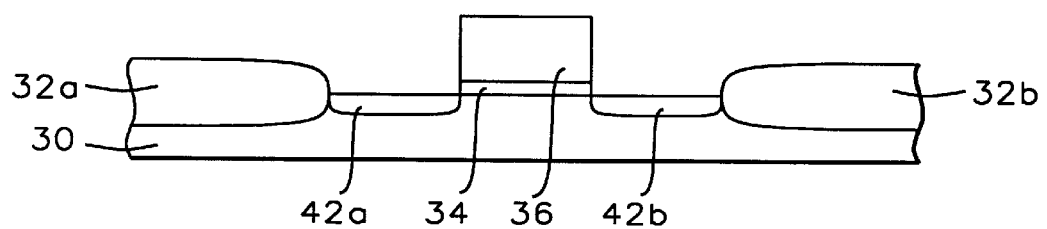

Referring now to FIG. 6, there is shown a schematic cross-sectional diagram illustrating the results of further processing of the semiconductor integrated circuit microelectronic fabrication whose schematic cross-sectional diagram is illustrated in FIG. 5. Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is stripped from the semiconductor integrated circuit microelectronic fabrication the ion implanted blanket silicon containing dielectric layer 38'.

The ion implanted blanket silicon containing dielectric layer 38' may be stripped from the semiconductor integrated circuit microelectronic fabrication whose schematic cross-sectional diagram is illustrated in FIG. 5 to form the semiconductor integrated circuit microelectronic fabrication whose schematic cross-sectional diagram is illustrated in FIG. 6 while employing methods as are conventional in the art of semiconductor integrated circuit microelectronic fabrication. Such methods typically include, but are not limited to: (1) dry plasma stripping methods employing plasma etchant gas compositions comprising active fluorine containing etchant species, as well as; (2) wet chemical stripping methods employing hydrofluoric acid containing wet chemical etchant solutions.

Upon forming the semiconductor integrated circuit microelectronic fabrication whose schematic cross-sectional diagram is illustrated in FIG. 6, there is formed a semiconductor integrated circuit microelectronic fabrication having formed therein a pair of source/drain regions with more optimally controlled junction depths, insofar as when forming upon a semiconductor substrate employed within the semiconductor integrated circuit microelectronic fabrication a blanket silicon containing dielectric layer as a ion implant screen layer there is employed a plasma enhanced chemical vapor deposition (PECVD) method which provides the blanket silicon containing dielectric layer within enhanced film thickness uniformity.

EXAMPLES

In order to demonstrate value of the present invention in providing a plasma enhanced chemical vapor deposited (PECVD) silicon oxide dielectric layer with enhanced film thickness uniformity, there was obtained four eight inch diameter (100) silicon semiconductor substrates.

Formed upon two of the semiconductor substrates was a silicon oxide dielectric layer formed employing the method of the present invention, which employed a first plasma enhanced chemical vapor deposition (PECVD) method which employed a silane silicon source material gas, a nitrous oxide oxidant source material gas and an argon carrier gas at a sufficiently low plasma power, a sufficiently low aggregate silicon source material gas plus oxidant source material gas:carrier gas flow rate ratio and a sufficiently high carrier gas atomic mass such that there was provided the silicon oxide dielectric layer with enhanced film thickness uniformity.

The first plasma enhanced chemical vapor deposition (PECVD) method also employed: (1) a reactor chamber pressure of about 5.5 torr, (2) a radio frequency source power of about 120 watts at a source radio frequency of 13.56 MHZ; (3) a substrate temperature of about 400 degrees centigrade; (4) a or showerhead nozzle spacing of about 475 mils; (5) a silane silicon source material gas flow rate of about 12 standard cubic centimeters per minute (sccm); (6) a nitrous oxide oxidant source material gas flow rate of about 360 standard cubic centimeters per minute (sccm); and (7) an argon carrier gas flow rate of about 2200 standard cubic centimeters per minute (sccm). The first plasma enhanced chemical vapor deposition (PECVD) method was employed to form the silicon oxide dielectric layers of a nominal thicknesses of either 100 angstroms or 2000 angstroms upon either of the first two semiconductor substrates.

Upon one each of the second two semiconductor substrates was formed a silicon oxide dielectric layer employing a second plasma enhanced chemical vapor deposition (PECVD) method employing a silane silicon source material gas, a nitrous oxide oxidant source material gas and a nitrogen as a carrier gas under conditions as are more conventionally employed within the art of semiconductor integrated circuit microelectronic fabrication. The second plasma enhanced chemical vapor deposition (PECVD) method also employed, when forming the silicon oxide dielectric layers: (1) a reactor chamber pressure of about 2.5 torr; (2) a radio frequency power of about 260 watts at a source radio frequency of 13.56 MHZ; (3) a semiconductor substrate temperature of about 400 degrees centigrade; (4) a showerhead nozzle spacing of about 400 mils; (5) a silane silicon source material gas flow rate of about 75 standard cubic centimeters per minute (sccm); (6) a nitrous oxide oxidant source material flow rate of about 1400 standard cubic centimeters per minute (sccm); and (7) a nitrogen carrier gas flow rate of about 3000 standard cubic centimeters per minute (sccm). The second plasma enhanced chemical vapor deposition (PECVD) method was also employed to form upon one of the two semiconductor substrates a silicon oxide dielectric layer of thickness of about 100 angstroms and upon the other of the two semiconductor substrates a silicon oxide dielectric layer of thickness about 2000 angstroms.

There was then measured for each of the four silicon oxide dielectric layers formed employing either of the two plasma enhanced chemical vapor deposition (PECVD) methods at either of the two thicknesses several parameters as are conventional in the art of semiconductor integrated circuit microelectronic fabrication. The parameters included: (1) film thickness uniformity (measured as a percent variation from a mean film thickness); (2) refractive index; (3) film stress; and (4) wet etch rate in 10:1 buffered oxide etchant (BOE). The results for the measured parameters are reported in Table I.

Additional sample wafers were also fabricated in accord with the foregoing first plasma enhanced chemical vapor deposition (PECVD) method and the second plasma enhanced chemical vapor deposition (PECVD) method to provide basis for calculation of a wafer-to-wafer film thickness uniformity, which is also reported within Table I.

TABLE I

| | PECVD oxide per invention | PECVD oxide conventional |
|---|---|---|
| Film Thickness Uniformity (%) Within Wafer | | |
| 2000 A Nominal | <1.5 | <2.5 |
| 100 A Nominal | <2.0 | <15 |
| Wafer to Wafer | <2.0 | <4.0 |
| Refractive Index | 1.47 | 1.46 |
| Film Stress (dyne/cm$^2$) | -8E8 | -6E8 |
| Wet Etch Rate (A/min) | 1800 | 3200 |

As is seen from review of the data within Table I, particularly when formed at exceedingly minimal thicknesses such as about 100 angstrom thicknesses, silicon oxide dielectric layers formed employing the plasma enhanced chemical vapor deposition (PECVD) method of the present invention are formed within enhanced film thickness uniformity in comparison with silicon oxide dielectric layers formed employing plasma enhanced chemical vapor deposition (PECVD) methods as are more conventional in the art of microelectronic fabrication.

While not wishing to be bound to any particular theory as to why there is formed with enhanced film thickness uniformity within a microelectronic fabrication a microelectronic layer while employing the method of the present invention, it is believed that within a conventional plasma enhanced chemical vapor deposition (PECVD) method when there is employed a nitrogen carrier gas and a higher aggregate silane silicon source material gas plus nitrous oxide oxidant source material:nitrogen carrier gas flow rate ratio there is typically obtained both: (1) a non-uniform distribution of the nitrogen carrier gas within a plasma enhanced chemical vapor deposition (PECVD) reactor chamber; and (2) an enhanced reflection of the radio frequency source plasma power within the plasma enhanced chemical vapor deposition (PECVD) reactor chamber, particularly when employing lower levels of radio frequency plasma which are generally desirable to provide lower deposition rates in order to form thinner silicon oxide dielectric layers. In contrast, within the present invention and the plasma enhanced chemical vapor deposition (PECVD) method of the present invention, it is believed that the use of a higher atomic mass inert carrier gas provides both: (1) a more uniform deposition gas mixture within a plasma enhanced chemical vapor deposition (PECVD) reactor chamber (this is believed to be due to the use of the higher atomic mass carrier gas), as well as; (2) a lower reflectivity of plasma power within the plasma enhanced chemical vapor deposition (PECVD) reactor chamber, particularly when there is employed a lower plasma power within the plasma enhanced chemical vapor deposition (PECVD) reactor chamber which is needed to provide a lower deposition rate for a thinner silicon oxide dielectric layer formed within the plasma enhanced chemical vapor deposition (PECVD) reactor chamber (this is believed to be due to the use of an inert carrier gas).

As is understood by a person skilled in the art, the preferred embodiments and examples of the present invention are illustrative of the present invention rather than limiting of the present invention. Revisions and modifications may be made to methods, materials, structures and dimensions employed within the preferred embodiments and examples of the present invention while still providing embodiments and examples which are within the spirit and scope of the present invention, as defined within the appended claims.

What is claimed is:

1. A method for forming a microelectronic layer comprising:

providing a substrate; and forming over the substrate the microelectronic layer while employing a plasma enhanced chemical vapor deposition (PECVD) method employing a source material gas and a carrier gas, wherein there is employed a sufficiently low plasma power, a sufficiently low source material gas:carrier gas flow rate ratio and a sufficiently high carrier gas atomic mass such that the microelectronic layer is formed with enhanced film thickness uniformity, and wherein the PECVD method employs: a radio frequency source plasma power of between about 50 to 200 watts at a source radio frequency of 13.56 MHz; a source material gas:carrier gas flow rate ratio of from about 1:100 to 1:300; a carrier gas atomic mass of at least about 30 amu; a reactor chamber pressure of from about 1 to 10 torr; a substrate temperature of from about 350 to 450° C.; and a showerhead spacing of from about 450 to 500 mils.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic fabrications and display image array optoelectronic fabrications.

3. The method of claim 1 wherein the microelectronic layer is selected from the group consisting of microelectronic conductor layers, microelectronic semiconductor layers and microelectronic dielectric layers.

4. The method of claim 1 wherein the carrier gas is selected from the group consisting of argon and xenon.

5. The method of claim 4 wherein the carrier gas does not include nitrogen or helium.

6. A method for forming a silicon containing microelectronic layer comprising:

providing a substrate; and forming over the substrate the silicon containing microelectronic layer while employing a plasma enhanced chemical vapor deposition (PECVD) method employing a silicon source material gas and a carrier gas, wherein there is employed a sufficiently low plasma power, a sufficiently low silicon source material gas::carrier gas flow rate ratio and a sufficiently high carrier gas atomic mass such that the silicon containing microelectronic layer is formed with enhanced film thickness uniformity, and wherein the PECVD method employs: a radio frequency source plasma power of between about 50 to 200 watts at a source radio frequency of 13.56 MHz; a silicon source material gas:carrier gas flow rate ratio of from about 1:100 to 1:300; a carrier gas atomic mass of at least about 30 amu; a reactor chamber pressure of from about 1 to 10 torr; a substrate temperature of from about 350 to 450° C.; and a showerhead spacing of from about 450 to 500 mils.

7. The method of claim 6 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic fabrications and display image array optoelectronic fabrications.

8. The method of claim 6 wherein the carrier gas is selected from the group consisting of argon and xenon.

9. The method of claim 8 wherein the carrier gas does not include nitrogen or helium.

10. The method of claim 6 wherein:

the silicon containing microelectronic layer is selected from the group consisting of silicon oxide layers, silicon nitride layers and silicon oxynitride layers; and there is employed in addition to the silicon source material gas an oxidant source material gas.

11. The method of claim 10 wherein:

the silicon source material gas:oxidant source material gas plus carrier gas flow rate ratio is from about 1:120 to about 1:360; and the carrier gas is an inert gas.

12. The method of claim 6 wherein the silicon containing microelectronic layer is employed as an ion implant screen layer.

13. The method of claim 1, wherein the PECVD method employs: a radio frequency source plasma power of between about 80 to 150 watts; and a source material gas:carrier gas flow rate ratio of from about 1:150 to 1:250.

14. The method of claim 1, wherein the PECVD method employs: a radio frequency source plasma power of between about 110 to 130 watts; and a source material gas:carrier gas flow rate ratio of from about 1:175 to 1:225.

15. The method of claim 6, wherein the PECVD method employs: a radio frequency source plasma power of between about 80 to 150 watts; and a source material gas:carrier gas flow rate ratio of from about 1:150 to 1:250.

16. The method of claim 6, wherein the PECVD method employs: a radio frequency source plasma power of between about 110 to 130 watts; and a source material gas:carrier gas flow rate ratio of from about 1:175 to 1:225.

17. A method for forming a silicon oxide dielectric layer comprising:

providing a substrate; and forming over the substrate the silicon oxide dielectric layer while employing a plasma enhanced chemical vapor deposition (PECVD) method employing a silane silicon source material gas, a nitrous oxide oxidant source material gas, and an argon carrier gas;

wherein the PECVD method employs: a reactor chamber pressure of from about 1 to 10 torr; a radio frequency source plasma power of between about 260 watts at a source radio frequency of 13.56 MHz; a substrate temperature of about 400° C.; a showerhead spacing of about 400 mils; a silane silicon source material gas flow rate of about 75 sccm; a nitrous oxide oxidant source material flow rate of about 1400 sccm; and a nitrogen carrier gas flow rate of about 3000 sccm such that the microelectronic layer is formed with enhanced film thickness uniformity.

* * * * *